(12) United States Patent
Morita

(10) Patent No.: US 10,333,037 B2
(45) Date of Patent: Jun. 25, 2019

(54) LIGHT-EMITTING-ELEMENT MOUNTING PACKAGE AND METHOD FOR MANUFACTURING THE SAME

(71) Applicant: NGK SPARK PLUG CO., LTD., Nagoya-shi, Aichi (JP)

(72) Inventor: Masahito Morita, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/033,702

(22) Filed: Jul. 12, 2018

(65) Prior Publication Data

US 2019/0019925 A1    Jan. 17, 2019

(30) Foreign Application Priority Data

Jul. 17, 2017    (JP) .................................. 2017-138669

(51) Int. Cl.
| | | |
|---|---|---|
| *H01L 33/00* | (2010.01) | |
| *H01L 33/54* | (2010.01) | |
| *H01L 21/48* | (2006.01) | |
| *H01L 33/48* | (2010.01) | |
| *H01L 33/62* | (2010.01) | |

(52) U.S. Cl.
CPC .............. *H01L 33/54* (2013.01); *H01L 21/48* (2013.01); *H01L 33/486* (2013.01); *H01L 33/62* (2013.01)

(58) Field of Classification Search
CPC ....... H01L 21/48; H01L 23/04; H01L 23/057; H01L 23/49827; H01L 33/54; H01L 33/62; H01L 33/483; H01L 33/486; H01L 33/642

USPC ..................................................... 257/97–101
See application file for complete search history.

(56) References Cited

U.S. PATENT DOCUMENTS

| | | | |
|---|---|---|---|
| 6,242,694 B1 | 6/2001 | Muraki | |
| 2016/0120017 A1 | 4/2016 | Momoi et al. | |
| 2017/0141531 A1* | 5/2017 | Kyono | ................. G02B 6/4239 |
| 2017/0291397 A1 | 10/2017 | Momoi et al. | |
| 2019/0013442 A1* | 1/2019 | Morita | ................... H01L 33/483 |

FOREIGN PATENT DOCUMENTS

| | | |
|---|---|---|
| JP | H04-084475 A | 3/1992 |
| JP | H11-126840 A | 5/1999 |
| JP | 4058172 B2 | 3/2008 |
| JP | 2016-084528 A | 5/2016 |

* cited by examiner

*Primary Examiner* — Brook Kebede
(74) *Attorney, Agent, or Firm* — Stites & Harbison, PLLC; Jeffrey A. Haeberlin; James R. Hayne

(57) ABSTRACT

A light-emitting-element mounting package includes a substrate including front and back surfaces, a lead pin disposed at the back surface of the substrate, and a ceramic plate including an opposing front surface that opposes the back surface of the substrate and an opposing back surface. The substrate has a first through hole that extends therethrough. The ceramic plate has a second through hole that extends therethrough. Conductive portions extend continuously within the second through hole and around openings of the second through hole in the opposing front and back surfaces. A flange portion of the lead pin is joined to the conductive portion at the opposing back surface. A conductive member is joined to the conductive portion at the opposing front surface. The ceramic plate is joined to the back surface of the substrate with a portion of the conductive member disposed in the first through hole.

15 Claims, 6 Drawing Sheets

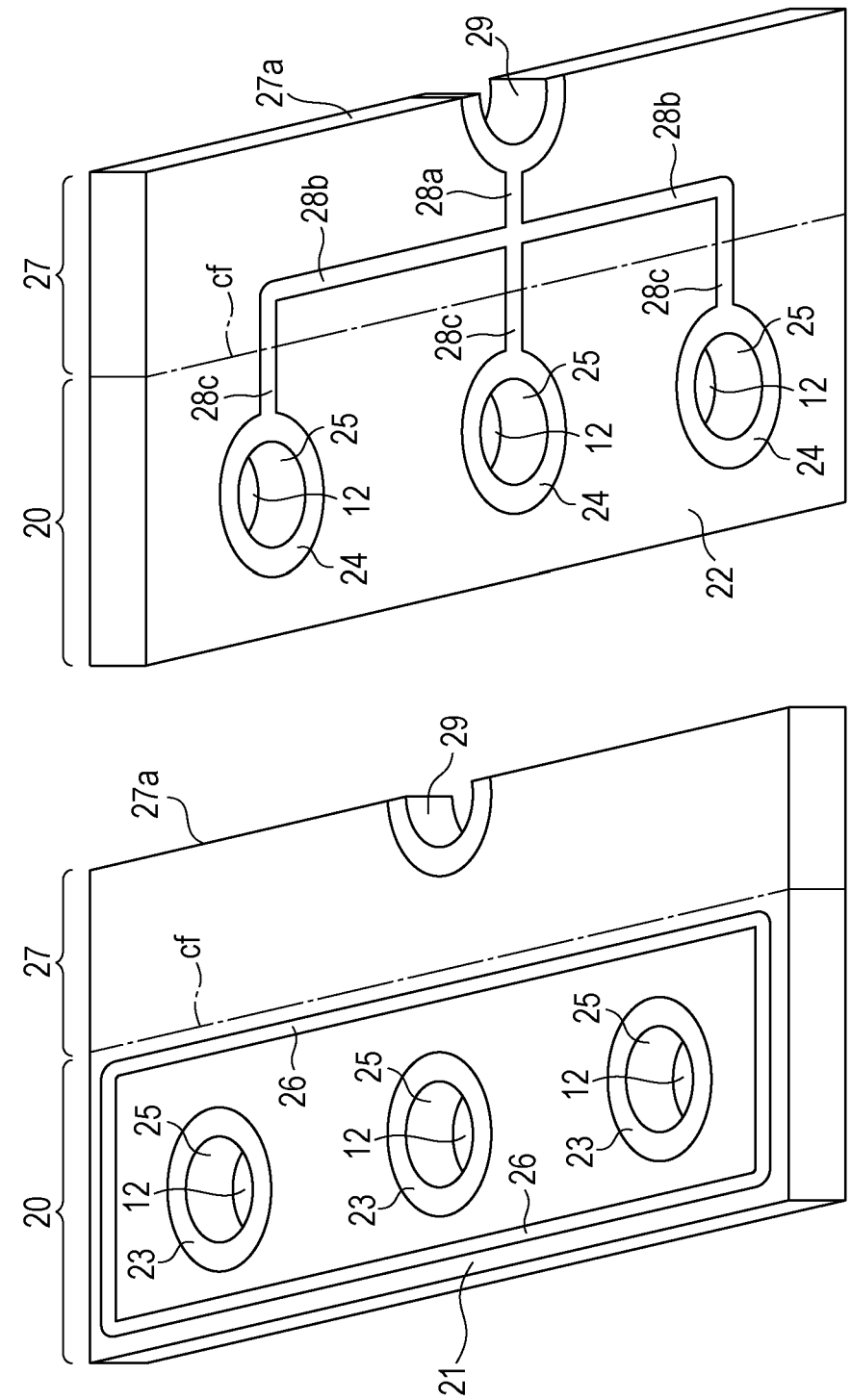

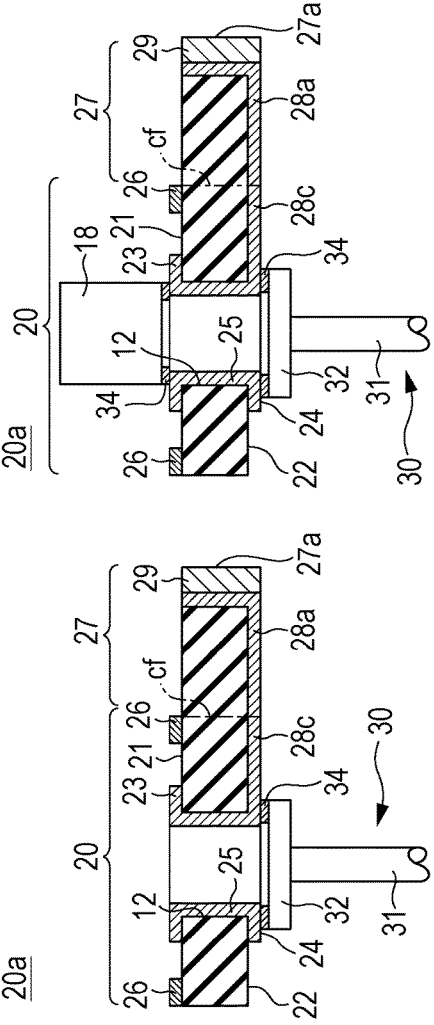
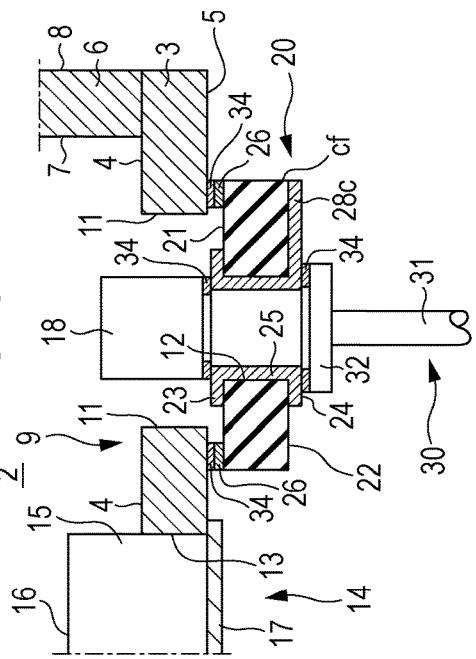
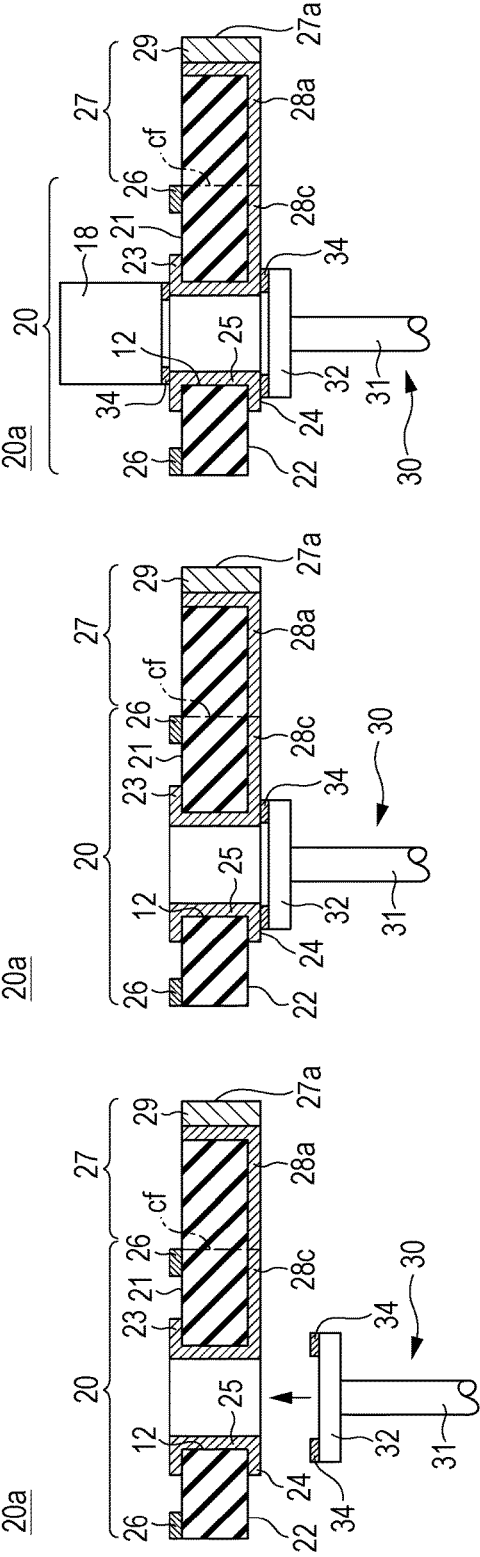
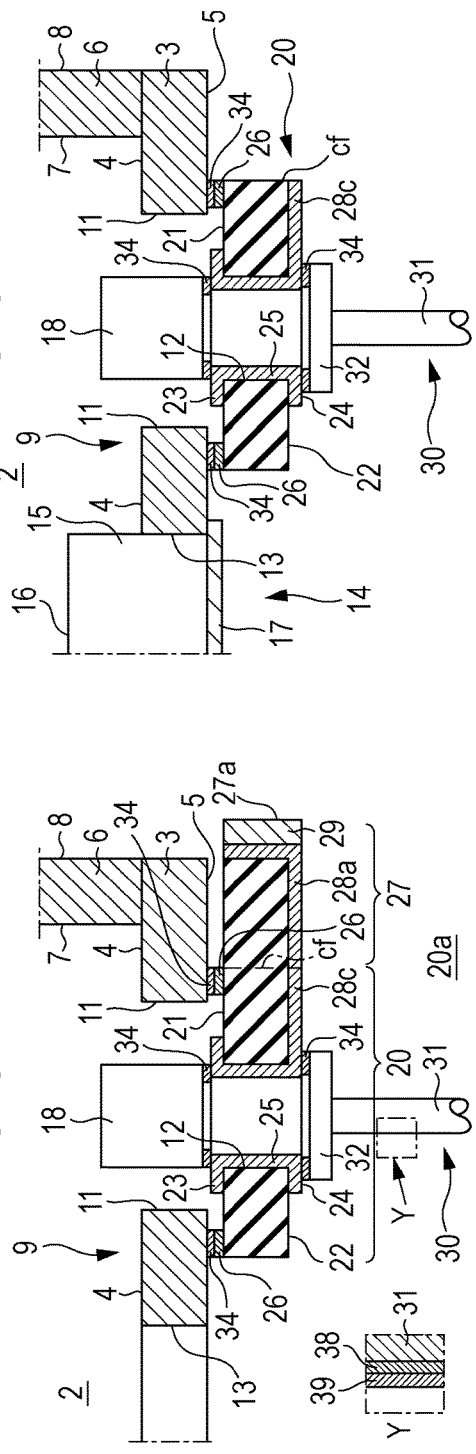

LIGHT-EMITTING-ELEMENT MOUNTING PACKAGE AND METHOD FOR MANUFACTURING THE SAME

CROSS REFERENCE TO RELATED APPLICATION

The present application claims priority to Japanese Patent Application No. 2017-138669, which was filed on Jul. 17, 2017, the disclosure of which is herein incorporated by reference in its entirety.

BACKGROUND OF THE INVENTION

Field of the Invention

The present invention relates to a light-emitting-element mounting package for mounting a light emitting element, such as a laser diode, and a method for manufacturing the light-emitting-element mounting package.

Description of the Related Art

PTL 1, for example, discloses an optical communication package including a base plate made of a metal; a frame joined to a surface of the base plate, the frame being made of a metal and rectangular-frame-shaped in plan view; a holder receiving portion that is formed in one side wall of the frame and through which a holder attached to one end of an optical fiber extends; a pair of ceramic substrates provided on a pair of side walls of the frame that are adjacent to the one side wall and that oppose each other, the ceramic substrates individually extending through the respective side walls; a plurality of conductive portions made of tungsten or molybdenum that extend through the ceramic substrates in an in-out direction of the frame; and a plurality of lead wires that are individually joined to outer ends of the conductive portions.

In the above-described optical communication package, electrical power is supplied to a light emitting element through the conductive portions. Since the conductive portions are made of tungsten, for example, and have a high electrical resistance, the electrical power supplied to the light emitting element cannot be sufficiently increased.

In addition, since the ceramic substrates provided with the conductive portions are inserted through and fixed to rectangular through holes formed in the side walls of the frame, the inner dimensions of the through holes and the outer dimensions of the ceramic substrates need to be within narrow dimensional tolerances. Otherwise, there is a risk that the ceramic substrates cannot be easily inserted or the airtightness of the package cannot be maintained due to excessive gaps between the ceramic substrates and the inner walls of the through holes.

PTL 2, for example, proposes an airtight package structure for a semiconductor laser pump module including a box-shaped package that is made of a metal and rectangular-parallelepiped-shaped. A plurality of through holes are formed in a pair of side surfaces of the package that oppose each other, and a plurality of relay terminals (lead pins) are individually inserted through the through holes so as to extend horizontally. The gaps between the relay terminals and the inner walls of the through holes are each sealed with glass solder or the like.

However, in the above-described airtight package structure, the gaps around the relay terminals inserted in the respective through holes formed in the side surfaces of the box-shaped package need to be individually filled with glass solder. This process is cumbersome, and it is difficult to reliably maintain sufficient airtightness.

In addition, in the case where the surfaces of the relay terminals (lead pins), which are electrically independent of each other, are to be coated with a metal film, such as a gold film, the relay terminals need to be individually subjected to electroless plating, or be electrically connected together only during electroplating. Therefore, the manufacturing process includes a large number of steps.

PATENT LITERATURE

PTL 1 is Japanese Unexamined Patent Application Publication No. 11-126840 (pages 1 to 5, FIGS. 1 to 5).

PTL 2 id Japanese Unexamined Patent Application Publication No. 04-84475 (pages 1 to 5, FIGS. 1 to 8).

BRIEF SUMMARY OF THE INVENTION

It is an object of the present invention to at least partially solve the problems discussed above in the description of the related art section and provide a light-emitting-element mounting package that enables electrical power supplied to the light emitting element mounted at a front surface of a substrate to be easily increased and that can be reliably maintained airtight. It is also an object of the present invention to provide a method for manufacturing the above-described package in a relatively small number of steps.

To achieve the above-described object, the present invention has been made based on the idea of joining a ceramic plate that supports a lead pin and provides external electrical insulation to a substrate in a region around an opening of a first through hole formed in the substrate, and forming a connecting line on an ear portion of the ceramic plate.

A light-emitting-element mounting package according to the present invention includes a substrate including a front surface and a back surface that oppose each other, the substrate being provided with a mounting portion for a light emitting element at the front surface side; a lead pin disposed at the back surface side; and a ceramic plate including an opposing front surface that opposes the back surface of the substrate and an opposing back surface that opposes the opposing front surface. The substrate has a first through hole that extends through the substrate between the front surface and the back surface. The ceramic plate includes a conductive portion formed at least on the opposing back surface and a connecting line having one end connected to the conductive portion and the other end extending to an outer periphery of the ceramic plate, the connecting line being formed at least on the opposing back surface or in the ceramic plate. The conductive portion formed on the opposing back surface of the ceramic plate is joined to the lead pin at a flange portion of the lead pin, the flange portion radially extending from a shaft of the lead pin and having a diameter greater than a diameter of the shaft. The ceramic plate is joined to the back surface of the substrate in a region around an opening of the first through hole in the back surface so that the lead pin is electrically connectable through the first through hole to the light emitting element to be mounted on the mounting portion for the light emitting element.

In other words, a light-emitting-element mounting package according to the present invention includes a substrate including a front surface and a back surface that opposes the front surface, the substrate defining a first through hole that extends through the substrate between the front surface and the back surface, the substrate provided with a mounting portion for a light emitting element at a front surface side of the substrate; a lead pin disposed at a back surface side of the substrate, the lead pin including a shaft and a flange portion radially extending from the shaft, the flange portion having a diameter greater than a diameter of the shaft; and a ceramic plate including an opposing front surface that opposes the back surface of the substrate, an opposing back surface that opposes the opposing front surface, and an outer periphery, the ceramic plate including a conductive portion formed at least on the opposing back surface of the ceramic plate, the ceramic plate including a connecting line having one end connected to the conductive portion and another end extending to the outer periphery of the ceramic plate, the connecting line being formed at least on the opposing back surface of the ceramic plate or in the ceramic plate. The conductive portion formed on the opposing back surface of the ceramic plate is joined to the lead pin at the flange portion of the lead pin. The ceramic plate is joined to the back surface of the substrate in a region around an opening of the first through hole at the back surface of the substrate so that the lead pin is electrically connectable through the first through hole to the light emitting element to be mounted on the mounting portion for the light emitting element.

The light-emitting-element mounting package has the following effects (1) and (2).

(1) The radially extending flange portion of the lead pin is fixed to the opposing back surface of the ceramic plate in a surface-to-surface manner in the region around the opening of the second through hole in the opposing back surface. In addition, the ceramic plate is fixed to the substrate in a surface-to-surface manner in the region around the first through hole in the substrate. Thus, the lead pin is supported by the substrate with two joining surfaces (planes) provided therebetween, the two joining surfaces including a joining surface between the flange portion and the opposing back surface of the ceramic plate and a joining surface between the opposing front surface of the ceramic plate and the back surface of the substrate. Therefore, the inside of the package can be easily and reliably maintained airtight without setting the dimensions within narrow dimensional tolerances as in the related art.

(2) The connecting line is formed at least on the opposing back surface of the ceramic plate or in the ceramic plate, the connecting line having one end connected to the conductive portion and the other end extending to the outer periphery of the ceramic plate. During manufacture of the package, a plurality of the conductive portions may be formed on the ceramic plate, and a plurality of the lead pins may be individually joined to the respective conductive portions. In such a case, by connecting a plurality of the connecting lines that are individually connected to the respective conductive portions to a single plating electrode, a metal film, such as a gold film, may be reliably formed on the surfaces of the lead pins without providing electrical connection individually.

A frame that surrounds the mounting portion may be joined (brazed) to the front surface of the substrate. Alternatively, a cap obtained by, for example, pressing a metal plate into a box shape may be joined to the substrate and sealed from the outside after the light emitting element is mounted. The above-described frame has a rectangular or circular tubular shape, and an opening of the frame is sealed from the outside by a cover plate made of a metal after the light emitting element is mounted on the mounting portion.

The light emitting element is, for example, a laser diode (LD) or a light emitting diode (LED).

The substrate, the lead pin, and a conductive member described below are made of, for example, Kovar (Fe, 29% Ni, 17% Co), alloy 42 (Fe, 42% Ni), or alloy 194 (Cu, 2.3% Fe, 0.03% P).

The surfaces of substrate, the lead pin, and the conductive member described below are successively covered by a nickel film and a gold film having predetermined thicknesses.

A pair of the first through holes that are circular in cross section, for example, may be formed in the substrate at separate positions.

The ceramic plate may be made of, for example, alumina, aluminum nitride, mullite, or glass ceramic.

The conductive portion may be made of, for example, tungsten (hereinafter referred to simply as W) or molybdenum (hereinafter referred to simply as Mo).

The present invention includes the light-emitting-element mounting package wherein the ceramic plate has (defines) a second through hole that extends through the ceramic plate between the opposing front surface and the opposing back surface, wherein the conductive portion is formed at least in a region around an opening of the second through hole in (at) the opposing back surface, and wherein the ceramic plate is joined to the back surface of the substrate so that the shaft of the lead pin is disposed in the first through hole in the substrate in plan view.

In this case, the above-described effects (1) and (2) can be more reliably obtained.

A plurality of the second through holes may be formed in the ceramic plate so as to linearly extend parallel to each other.

The present invention also includes the light-emitting-element mounting package wherein the conductive portion is formed continuously on an inner wall surface of the second through hole, in a region around an opening of the second through hole in (at) the opposing front surface, and in the region around the opening of the second through hole in (at) the opposing back surface, wherein a conductive member having a diameter greater than an inner diameter of the second through hole is joined to the conductive portion formed in the region around the opening of the second through hole in (at) the opposing front surface, and wherein at least a portion of the conductive member is disposed in the first through hole in (of) the substrate and is spaced from an inner wall surface of the first through hole.

In this case, the following effect (3) can be obtained.

(3) The light emitting element to be mounted on the mounting portion at the front surface of the substrate is electrically connectable to the lead pin by a bonding wire or the like through the conductive member that is disposed in the first through hole in the substrate and that has a diameter greater than the inner diameter of the second through hole in the ceramic plate. Therefore, unlike the case in which the light emitting element is electrically connected to the lead pin only by a metalized layer, a sufficient amount of current can be supplied in accordance with an increase in electrical power to be supplied to the light emitting element.

The present invention also includes the light-emitting-element mounting package wherein the flange portion of the lead pin has a diameter greater than the inner diameter of the second through hole, and the diameter of the conductive member is smaller than an inner diameter of the first through hole.

In this case, the flange portion (head portion) of the lead pin can be reliably joined to the conductive portion on the opposing back surface of the ceramic plate in the region around the second through hole. In addition, the conductive member can be reliably joined to the conductive portion on the opposing front surface of the ceramic plate in the region around the second through hole without causing the conductive member to come into contact with the inner wall surface of the first through hole in the substrate. Therefore, the structure of the package can be reliably obtained.

The present invention also includes the light-emitting-element mounting package wherein the conductive portion formed in the region around the opening of the second through hole in (at) the opposing front surface of the ceramic plate is surrounded by and spaced from the inner wall surface of the first through hole in (of) the substrate, and wherein the substrate and the ceramic plate are joined together with a metalized layer and a solder layer provided therebetween, the metalized layer being formed on the opposing front surface so as to surround and be spaced from the conductive portion formed in the region around the opening of the second through hole in (at) the opposing front surface, the solder layer being formed along the metalized layer.

In this case, the substrate and the ceramic plate are joined together with the metalized layer and the solder layer provided therebetween, the metalized layer being formed at the periphery of the opposing front surface so as to surround and be spaced from the conductive portion formed in the region around the opening of the second through hole in the opposing front surface, the solder layer being formed along the metalized layer. Therefore, the above-described effect (2) can be reliably obtained.

In addition, the following effect (4) can also be obtained.

(4) The metalized layer formed on the opposing front surface of the ceramic plate is spaced from the conductive portion formed in the region around the opening of the second through hole in the opposing front surface. Therefore, when the ceramic plate is fixed to the back surface of the substrate in the region around the first through hole, solder or the like provided on the metalized layer does not easily come into contact with the lead pin by accident, so that the risk of short-circuiting, for example, can be reduced. In addition, since the conductive portion formed in the region around the opening of the second through hole in the opposing front surface is surrounded by and spaced from the inner wall surface of the first through hole in the substrate, a failure due to contact between the conductive portion and the substrate does not easily occur.

The metalized layer is also made of, for example, W or Mo.

The solder layer may be made of, for example, a silver solder (for example, Ag—Cu alloy).

The present invention also includes the light-emitting-element mounting package wherein a space inside the conductive portion formed on the inner wall surface of the second through hole is filled with a conductor that is the same as a conductor that forms the conductive portion, or a connection conductor that connects the flange portion of the lead pin to the conductive member is disposed in the space. In other words, the conductive portion formed on the inner wall surface of the second through hole defines a space, and the space is filled with a conductor that is the same material as a material that forms the conductive portion, or the conductive portion formed on the inner wall surface of the second through hole defines a space, and a connection conductor that connects the flange portion of the lead pin to the conductive member is disposed in the space.

In this case, the inside (hollow portion) of the second through hole surrounded by the conductive portion formed on the ceramic plate is filled with a conductor similar to the conductive portion, or a connection conductor that connects the flange portion of the lead pin to the conductive member is disposed therein. Therefore, the lead pin and the conductive member can be more reliably electrically connected to each other (hereinafter referred to as effect (5)).

The present invention also includes the light-emitting-element mounting package wherein the substrate and the mounting portion for the light emitting element are separate components, wherein the mounting portion for the light emitting element is included in a radiator having a thermal conductivity higher than a thermal conductivity of the substrate, and wherein the radiator is joined to the substrate in a position such that the radiator is inserted through a third through hole that extends through the substrate between the front surface and the back surface. In other words, the substrate defines a third through hole that extends through the substrate between the front surface and the back surface, the substrate and the mounting portion for the light emitting element are separate components, the mounting portion for the light emitting element is included in a radiator having a thermal conductivity higher than a thermal conductivity of the substrate, and the radiator is joined to the substrate such that the radiator is inserted through the third through hole.

In this case, the radiator including the mounting portion for the light emitting element has a thermal conductivity greater than that of the substrate, and is inserted through and fixed to the third through hole. Therefore, the heat generated by the light emitting element mounted on the mounting portion can be effectively radiated to the outside of the package through the radiator (hereinafter referred to as effect (6)).

The radiator may be made of copper, silver, aluminum, or an alloy containing any of these as a base metal.

The present invention also includes the light-emitting-element mounting package wherein the third through hole is rectangular, square, or circular in plan view, and the radiator is rectangular-parallelepiped-shaped, cubical, or solid cylindrical and includes a flange that extends along a periphery of a bottom surface of the radiator and that is capable of being joined to the back surface of the substrate in a region around an opening of the third through hole in the back surface. In other words, the third through hole is rectangular, square, or circular, and the radiator is rectangular-parallelepiped-shaped, cubical, or solid cylindrical. The radiator includes a flange that extends along a periphery of a bottom surface of the radiator, and the flange is capable of being joined to the back surface of the substrate in a region around an opening of the third through hole at the back surface of the substrate.

In this case, the flange that extends along the periphery of the bottom surface of the main body of the radiator is joined to the back surface of the substrate in the region around the opening of the third through hole in the back surface with solder or the like provided therebetween. Accordingly, the effects (1) and (5) can be reliably obtained.

The present invention also includes the light-emitting-element mounting package wherein a difference in coefficient of linear expansion between the substrate and the ceramic plate is 5 ppm ($K^{-1}$) or less.

In such a case, since the difference in coefficient of linear expansion between the ceramic plate and the substrate is as low as 5 ppm ($K^{-1}$) or less, the thermal stress applied to the joining portions of the ceramic plate and the substrate is reduced. Accordingly, the above-described effect (1) can be more reliably obtained.

In a method for manufacturing a light-emitting-element mounting package according to the present invention, the light-emitting-element mounting package includes a substrate, a lead pin, and a ceramic plate, the substrate including a front surface and a back surface that oppose each other and being provided with a mounting portion for a light emitting element at the front surface side, the lead pin being disposed at the back surface side, the ceramic plate including an opposing front surface that opposes the back surface of the substrate and an opposing back surface that opposes the opposing front surface. The method includes a step of preparing the substrate having a first through hole that extends through the substrate between the front surface and the back surface that oppose each other; a step of preparing a ceramic plate including an opposing front surface to be arranged to oppose the back surface of the substrate, an opposing back surface that opposes the opposing front surface, and an ear portion to be removed by dividing the ceramic plate, the ceramic plate having a conductive portion formed at least on the opposing back surface thereof, a plating electrode formed on an outer side surface of the ear portion, and a connecting line formed so as to extend between the plating electrode and the conductive portion at least in the ceramic plate or on the opposing back surface; a step of joining the lead pin to the opposing back surface of the ceramic plate by joining a flange portion of the lead pin to the conductive portion on the opposing back surface of the ceramic plate, the flange portion radially extending from a shaft of the lead pin and having a diameter greater than a diameter of the shaft; a plating step of applying an electric current to the plating electrode to form a metal film at least on outwardly exposed surfaces of the shaft and the flange portion of the lead pin by metal electroplating; and a joining step of joining the ceramic plate to the back surface of the substrate so that the lead pin is electrically connectable through the first through hole to the light emitting element to be mounted on the mounting portion for the light emitting element.

In other words, in a method for manufacturing a light-emitting-element mounting package according to the present invention, the light-emitting-element mounting package includes a substrate, a lead pin, and a ceramic plate, the substrate including a front surface and a back surface that opposes the front surface, the substrate provided with a mounting portion for a light emitting element at a front surface side of the substrate, the lead pin disposed at a back surface side of the substrate, the ceramic plate including an opposing front surface that opposes the back surface of the substrate and an opposing back surface that opposes the opposing front surface. The methods includes a step of preparing the substrate, the substrate defining a first through hole that extends through the substrate between the front surface and the back surface; a step of preparing the ceramic plate, the ceramic plate including an ear portion having an outer side surface, the ear portion to be removed by dividing the ceramic plate, the ceramic plate including a conductive portion formed at least on the opposing back surface thereof, the ceramic plate including a plating electrode formed on the outer side surface of the ear portion, and the ceramic plate including a connecting line formed so as to extend between the plating electrode and the conductive portion at least in the ceramic plate or on the opposing back surface of the ceramic plate; a step of joining the lead pin to the opposing back surface of the ceramic plate by joining a flange portion of the lead pin to the conductive portion on the opposing back surface of the ceramic plate, the flange portion radially extending from a shaft of the lead pin and having a diameter greater than a diameter of the shaft; a plating step of applying an electric current to the plating electrode to form a metal film at least on outwardly exposed surfaces of the shaft and the flange portion of the lead pin by metal electroplating; and a step of joining the ceramic plate to the back surface of the substrate so that the lead pin is electrically connectable through the first through hole to the light emitting element to be mounted on the mounting portion for the light emitting element.

According to the above-described manufacturing method, the package having the above-described effects (1) to (6) can be reliably manufactured in a relatively small number of steps (hereinafter referred to as effect (7)). In particular, since the ceramic plate includes the ear portion having a main portion of the connecting line and the plating electrode, a nickel film and a gold film, for example, may be successively formed on the surfaces of a plurality of the lead pins or a plurality of conductive members by electroplating.

The ceramic plate is formed by subjecting a green sheet including the ear portion to a first firing process and then to a second firing process after the conductive portion, the connecting line, and the plating electrode are formed thereon, or by simultaneously firing a green sheet and the conductive portion, the connecting line, and the plating electrode formed thereon.

In the plating step, a nickel film that serves an underlayer for solder when the lead pin is brazed to the surface of the conductive portion is formed.

In the plating step, a nickel film and a gold film are successively formed on the surfaces of the lead pin and a conductive member.

The joining material (solder) used to join the substrate and the ceramic plate together or to join the ceramic plate to the lead pin or the conductive member described below contains at least one or more of alumina, silica, boron oxide ($B_2O_3$), zinc oxide (ZnO), lead oxide (PbO), calcium oxide (CaO), silver (including the above-described silver solder), palladium (Pd), platinum (Pt), copper (Cu), gold (Au), and carbon (C).

The present invention includes the method for manufacturing the light-emitting-element mounting package wherein, in the step of preparing the ceramic plate, a second through hole is formed so as to extend through the ceramic plate between the opposing front surface and the opposing back surface, and the conductive portion is formed at least in a region around an opening of the second through hole in (at) the opposing back surface, and wherein, in the joining step (i.e., the step of joining the ceramic plate to the back surface of the substrate), the ceramic plate is joined to the back surface of the substrate so that the shaft of the lead pin is disposed in the first through hole of the substrate in plan view.

In this case, the package having the above-described effect (7) can be reliably manufactured.

The present invention also includes the method for manufacturing the light-emitting-element mounting package wherein, in the step of preparing the ceramic plate, the conductive portion is formed continuously on an inner wall surface of the second through hole, in a region around an opening of the second through hole in (at) the opposing front surface, and in the region around the opening of the second through hole in (at) the opposing back surface, wherein the method further includes a step (i.e., a step of joining a conductive member to the conductive portion) of joining a conductive member having a diameter greater than an inner diameter of the second through hole to the conductive portion in the region around the opening of the second through hole in the opposing front surface of the ceramic plate, and wherein, in the joining step (i.e., the step of joining the ceramic plate to the back surface of the substrate), at least a portion of the conductive member is in the first through hole in the substrate and is spaced from an inner wall surface of the first through hole.

In this case, the package having the above-described effects (1) to (6) can be reliably manufactured.

When a plurality of the conductive members are individually joined to a plurality of the conductive portions formed in regions around openings of the respective second through holes in the opposing front surface, the above-described metal films are similarly formed on the conductive members.

The present invention also includes the method for manufacturing the light-emitting-element mounting package wherein the joining step (i.e., the step of joining the ceramic plate to the back surface of the substrate) is performed before the plating step.

In this case, the plating step is performed after the opposing front surface of the ceramic plate is connected to the back surface of the substrate. Therefore, the surfaces of a plurality of the lead pins and a plurality of the conductive members may be reliably subjected to electroplating at the same time (hereinafter referred to as effect (8)).

The present invention also includes the method for manufacturing the light-emitting-element mounting package further including a step of removing the ear portion from the ceramic plate after the plating step.

In this case, since the ear portion is removed from the ceramic plate after the plating step, accidental short-circuiting between a plurality of the lead pins through a plurality of the connecting lines and the plating electrode can be reliably prevented (hereinafter referred to as effect (9)).

BRIEF DESCRIPTION OF THE DRAWINGS

Illustrative aspects of the invention will be described in detail with reference to the following figures wherein:

FIG. 4A is a perspective view of an opposing front surface of a ceramic plate included in the package, and FIG. 4B is a perspective view of an opposing back surface of the ceramic plate;

FIGS. 5A to 5E illustrate steps for manufacturing the light-emitting-element mounting package;

DETAILED DESCRIPTION OF EXEMPLARY EMBODIMENTS OF THE INVENTION

Embodiments of the present invention will now be described.

Figure 1:
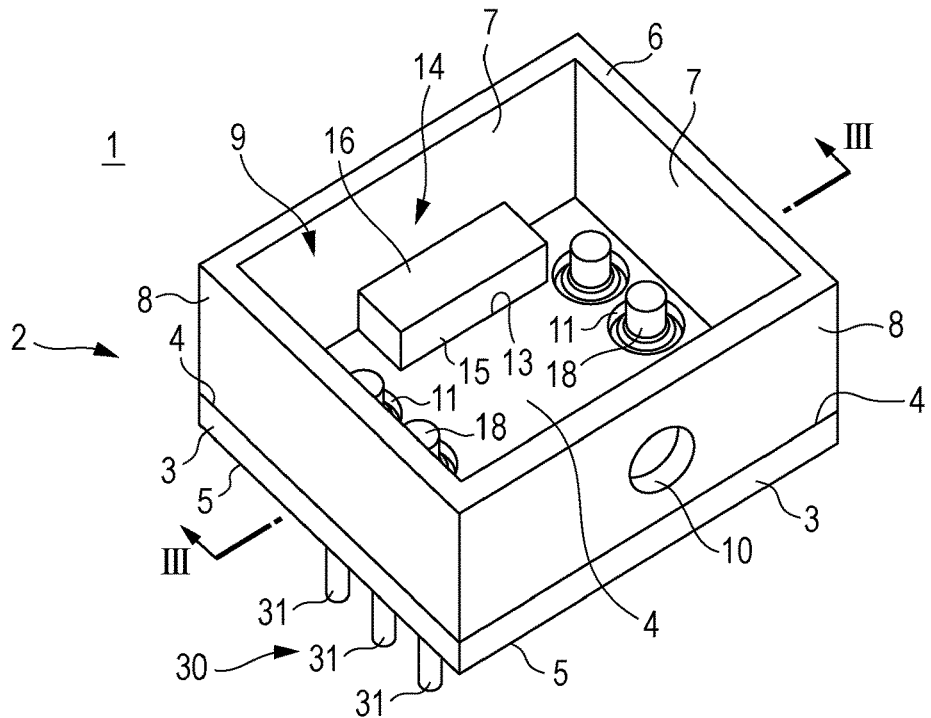
FIG. 1 is a perspective view of a light-emitting-element mounting package according to an embodiment of the present invention.
Figure 2:
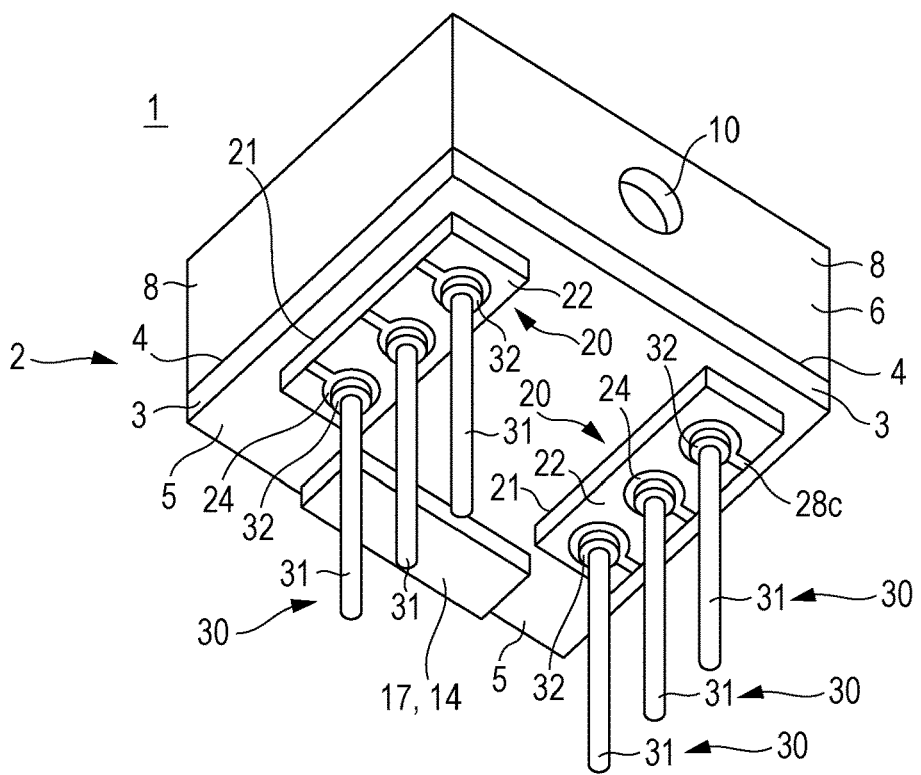
FIG. 2 is a perspective view of the light-emitting-element mounting package viewed in another direction.
Figure 3:
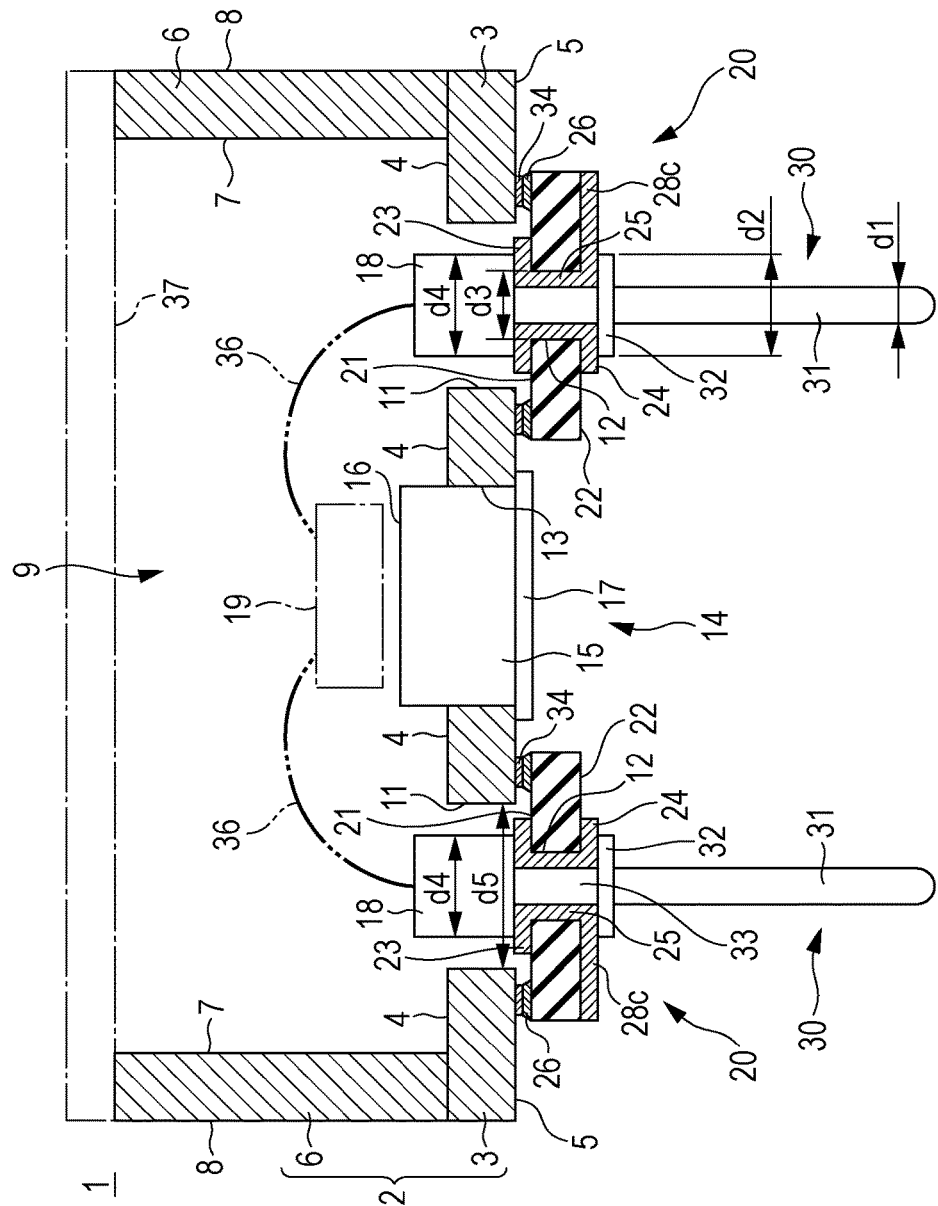
FIG. 3 is a vertical sectional view taken along line III-III in FIG. 1.

FIG. 1 is a perspective view of a light-emitting-element mounting package (hereinafter referred to simply as a package) 1 according to an embodiment viewed from above. FIG. 2 is a perspective view of the package 1 viewed from below. FIG. 3 is a vertical sectional view taken along line III-III in FIG. 1.

As illustrated in FIGS. 1 to 3, the package 1 includes a box-shaped package body 2, a pair of ceramic plates 20 provided at the bottom of the package body 2, and a plurality of lead pins 30 joined to the bottom of the ceramic plates 20. Three lead pins 30, for example, are provided for each ceramic plate 20, and the top end (one end) of each lead pin 30 is located at the bottom side.

The package body 2 includes a plate-shaped substrate 3 and a frame 6. The substrate 3 includes a front surface 4 and a back surface 5 that vertically oppose each other. The frame 6 stands on the front surface 4 of the substrate 3 at the periphery thereof, and includes inner side surfaces 7 and outer side surfaces 8 having a rectangular or square shape in plan view. A mounting portion for a light emitting element (not shown) or a mounting portion included in a radiator described below is disposed at the front surface 4 of the substrate 3 surrounded by the inner side surfaces 7 of the frame 6.

The substrate 3, the frame 6, and the lead pins 30 are made of, for example, Kovar. The substrate 3 and the frame 6 are joined together by, for example, brazing to form the package body 2. A nickel film and a gold film having predetermined thicknesses are successively formed on the package body 2 over the entire surface thereof. A cavity 9 having a rectangular parallelepiped shape is formed in the space surrounded by the front surface 4 of the substrate 3 and the inner side surfaces 7 of the frame 6.

As illustrated in FIGS. 1 and 3, a plurality of first through holes 11, for example, three first through holes 11, are arranged along each of a pair of opposing sides of the substrate 3. The first through holes 11 extend through the substrate 3 between the front surface 4 and the back surface 5, and are circular in plan view.

A pair of left and right ceramic plates 20, each of which is disposed at a location where three of the first through holes 11 are formed, are individually joined (fixed) to the back surface 5 of the substrate 3 so as to airtightly seal the first through holes 11.

As illustrated in FIGS. 4A and 4B, each ceramic plate 20 is included in a ceramic plate (ceramic base plate) 20a and constitutes a portion thereof. The ceramic plate 20a is made of, for example, alumina, and includes an opposing front surface 21 that opposes the back surface 5 of the substrate 3 and an opposing back surface 22 that opposes the opposing front surface 21. The ceramic plate 20a is divided into the ceramic plate 20 and an ear portion 27 by an imaginary cutting line (outer periphery) cf. The difference in coefficient of linear expansion between the substrate 3 and the ceramic plate 20a, 20 is 5 ppm ($K^{-1}$) or less.

As illustrated in FIGS. 4A and 4B, the ceramic plate 20 has three second through holes 12 that linearly extend therethrough between the opposing front surface 21 and the opposing back surface 22 and that are circular in plan view. Each second through hole 12 is provided with conductive portions 23, 24, and 25 that continuously extend along an inner wall surface of the second through hole 12 and in regions around the openings of the second through hole 12 in the opposing front surface 21 and the opposing back surface 22 so as to form the shape of an angular letter 'U' in vertical sectional view. A metalized layer 26 is provided on the opposing front surface 21 of the ceramic plate 20 at the periphery thereof. The metalized layer 26 is rectangular in plan view, and surrounds the three conductive portions 23 so as to be spaced from the conductive portions 23.

A semi-arc-shaped plating electrode 29 that is recessed in a semicircular shape in plan view is formed on an outer side surface 27a of the ear portion 27. In addition, connecting lines 28a, 28b, and 28c that connect the plating electrode 29 to the three conductive portions 24 are formed on the opposing back surface 22 of the ear portion 27.

The ceramic plate 20 is obtained by cutting the ceramic plate 20a along the cutting plane cf and removing the ear portion 27. The conductive portions 23 to 25, the metalized layer 26, the connecting lines 28a to 28c, and the plating electrode 29 are made of W or Mo. The ceramic plate 20 may be obtained by cutting a ceramic mother board in which a plurality of ceramic plates are arranged next to each other in horizontal and vertical directions with rectangular cutting planes cf extending along the outlines thereof in plan view.

As illustrated in FIGS. 2 and 3, each of the pair of ceramic plates 20 is individually joined to the back surface 5 of the substrate 3 so as to cover the corresponding three first through holes 11. Each ceramic plate 20 is joined to the back surface 5 with the metalized layer 26, which is provided on the opposing front surface 21 of the ceramic plate 20 at the periphery thereof, and a solder layer 34, which is formed along the metalized layer 26, provided therebetween. The solder layer 34 is made of, for example, a silver solder (Ag—Cu based alloy).

Conductive members 18 having a solid cylindrical shape are individually joined to the top surfaces of the three conductive portions 23 on the opposing front surface 21 of each ceramic plate 20 with a solder layer similar to that described above (not shown) provided between each conductive member 18 and the corresponding conductive portion 23. The outer peripheral surface of each conductive member 18 is spaced from the inner wall surface of the corresponding first through hole 11 in the substrate 3. The conductive members 18 are also made of Kovar.

In addition, disc-shaped flange portions (head portions) 32 of the lead pins 30 are individually joined to the bottom surfaces of the three conductive portions 24 on the opposing back surface 22 of each ceramic plate 20 with a solder layer similar to that described above (not shown) provided between each flange portion 32 and the corresponding conductive portion 24. The flange portions 32 are provided at the top ends of shafts 31 of the lead pins 30 and extend radially from the shafts 31.

As illustrated in FIG. 3, a diameter d2 of the flange portion 32 of each lead pin 30 is greater than a diameter d1 of the shaft 31 of the lead pin 30, and is also greater than an inner diameter d3 of each second through hole 12. A diameter d4 of each conductive member 18 is smaller than an inner diameter d5 of each first through hole 11.

As illustrated at the right in FIG. 3, the space inside the cylindrical conductive portion 25 formed on the inner wall surface of each second through hole 12 may be left hollow (vacant). Alternatively, as illustrated at the left in FIG. 3, a connection conductor 33 made of Kovar may be placed in the space inside the conductive portion 25 formed on the inner wall surface of each second through hole 12. The connection conductor 33 has a solid cylindrical shape and connects the corresponding conductive member 18 to the flange portion 32 of the corresponding lead pin 30. Alternatively, the space inside the conductive portion 25 may be filled with a solid cylindrical conductive portion (not shown) made of a material such as W that is the same as the material of the conductive portion 25.

In addition, as illustrated in FIGS. 1 and 2, one side wall of the frame 6 has a clearance hole 10 having a relatively large diameter that extends therethrough between the inner side surface 7 and the outer side surface 8 thereof. The clearance hole 10 enables light emitted by a light emitting element, such as a laser diode, mounted at the front surface 4 of the substrate 3 to travel outward, or enables connection to an end of an optical fiber (not shown) through a holder (not shown) that projects from the opening of the clearance hole 10 in the outer side surface 8.

As illustrated in FIGS. 1 to 3, the substrate 3 has a third through hole 13 that is rectangular in plan view and that extends therethrough between the front surface 4 and the back surface 5 in a region adjacent to a side wall of the frame 6 opposite to the side wall having the clearance hole 10. A rectangular-parallelepiped-shaped main body 15 of the radiator 14 is inserted into the third through hole 13 through the back surface 5 of the substrate 3. The radiator 14 includes a flange 17 that extends along the periphery of the bottom surface of the main body 15 and has a shape similar to the shape of the bottom surface of the main body 15. The flange 17 is joined to the back surface 5 of the substrate 3 with a solder layer similar to that described above provided therebetween, so that the radiator 14 is fixed to the back surface 5 of the substrate 3 so as to cover the third through hole 13.

The radiator 14 is made of copper or the like that has a thermal conductivity higher than that of the substrate 3.

As illustrated in FIG. 3, a light emitting element 19, such as a laser diode, is mounted on a mounting portion 16 that defines the top surface of the main body 15 of the radiator 14. The light emitting element 19 is electrically connectable to the conductive members 18 individually by a plurality of bonding wires 36.

After the light emitting element 19 is mounted, a metal cover plate 37 is welded or brazed to the top end face of the frame 6. As a result, the cavity 9 in which the light emitting element 19 is disposed is sealed from the outside.

In the above-described package 1, the radially extending flange portion 32 of each lead pin 30 is fixed to the corresponding ceramic plate 20 in a surface-to-surface manner in the region around the opening of the corresponding second through hole 12 in the opposing back surface 22. In addition, each ceramic plate 20 is fixed to the substrate 3 in a surface-to-surface manner in the region around the corresponding first through holes 11 in the substrate 3 with the metalized layer 26, which is formed at the periphery of the opposing front surface 21, provided therebetween. Thus, each lead pin 30 is supported by the substrate 3 with two joining surfaces provided therebetween, the two joining surfaces including a joining surface between the flange portion 32 and the opposing back surface 22 of the corresponding ceramic plate 20 and a joining surface between the opposing front surface 21 of the ceramic plate 20 and the back surface 5 of the substrate 3. Therefore, the cavity 9 can be easily and reliably maintained airtight.

In addition, the metalized layer 26 formed on the opposing front surface 21 of each ceramic plate 20 is spaced from the conductive portions 23 formed in the regions around the openings of the second through holes 12 in the opposing front surface 21. Therefore, when the ceramic plate 20 is joined to the back surface 5 of the substrate 3 in the region around the corresponding first through holes 11, solder or the like provided on the metalized layer 26 does not easily come into contact with the lead pins 30 by accident, so that the risk of short-circuiting, for example, can be reduced.

During manufacture, a plurality of second through holes 12 are formed in each ceramic plate 20, and the conductive members 18 and the lead pins 30 are individually joined to a plurality of conductive portions 23 and a plurality of conductive portions 24 formed in the regions around the openings of the second through holes 12 in the opposing front surface 21 and the opposing back surface 22, respectively. At this time, by connecting the connecting lines 28c that are individually connected to the respective conductive portions 24 to a single plating electrode 29, the surfaces of the conductive members 18 and the lead pins 30 can be reliably coated with a metal film, such as a gold film, without providing electrical connection individually.

When the connection conductor 33, which connects the flange portion 32 of the corresponding lead pin 30 to the corresponding conductive member 18, is disposed in the space surrounded by the conductive portion 25 (hollow portion) in each of second through holes 12 formed in each ceramic plate 20, the lead pin 30 and the conductive member 18 can be more reliably electrically connected to each other.

In addition, the radiator 14 including the mounting portion 16 for the light emitting element 19 has a thermal conductivity higher than that of the substrate 3, and is inserted through and fixed to the third through hole 13. Therefore, heat generated by the light emitting element 19 mounted on the mounting portion 16 can be effectively dissipated to the outside of the package through the radiator 14.

Accordingly, the package 1 has the above-described effects (1) to (6).

A method for manufacturing the package 1 will now be described.

The first through holes 11 are formed in a metal base plate that serves as the substrate 3 in advance.

Also, the ceramic plates 20a are manufactured by a common method. As illustrated in FIGS. 4A and 4B, each ceramic plate 20a includes the second through holes 12 that extend therethrough between the opposing front surface 21 that is to be arranged to oppose the back surface 5 of the substrate 3 and the opposing back surface 22 that opposes the opposing front surface 21, and the ear portion 27 having no second through holes 12. The conductive portions 23 to 25 are formed integrally with each other on the inner wall surface of each second through hole 12 and in regions around the openings of the second through hole 12 in the opposing front surface 21 and the opposing back surface 22. Also, the plating electrode 29 is formed on the outer side surface 27a of the ear portion 27, and the connecting lines 28a to 28c are formed on the opposing back surface 22 of the ceramic plate 20a so as to extend between the plating electrode 29 and the conductive portions 24 and 25.

Next, as illustrated in FIGS. 5A and 5B, the lead pin 30 including an annular solder layer 34 at the periphery of the top surface of the flange portion 32 is joined to each of the conductive portions 24 on the opposing back surface 22 of the ceramic plate 20 in each ceramic plate 20a.

Next, as illustrated in FIG. 5C, the conductive member 18 including an annual solder layer 34 at the periphery of the bottom surface is joined to each of the conductive portions 23 on the opposing front surface 21 of the ceramic plate 20 in each ceramic plate 20a. In this state, the second through hole 12, the conductive member 18, and the shaft 31 of the lead pin 30 are coaxial.

The space inside the cylindrical conductive portion 25 (hollow portion) may be filled with a material that is the same as the material of the conductive portion 25, or the connection conductor 33 may be inserted therein in advance.

Then, as illustrated in FIG. 5D, each ceramic plate 20a, to which three conductive members 18 and three lead pins 30 are joined at the top and bottom thereof, is placed on the back surface 5 of the substrate 3 so that the conductive members 18 are individually inserted through the respective first through holes 11 at the centers thereof. The substrate 3 has the frame 6 joined to the periphery of the front surface 4 thereof in advance. Then, each ceramic plate 20a is joined to the back surface 5 of the substrate 3 with the solder layer 34 provided therebetween, the solder layer 34 being arranged along the metalized layer 26 formed on the opposing front surface 21 of the ceramic plate 20 at the periphery thereof.

In this state, an electrode rod (not shown) is brought into contact with the plating electrode 29 on the ear portion 27 of each ceramic plate 20a, and nickel electroplating and gold electroplating are successively performed by immersion in a nickel electroplating bath (not shown) and a gold electroplating bath (not shown) and application of an electric current to the above-described electrode rode and a counter electrode (not shown).

As a result, as illustrated in the enlarged view of part Y surrounded by the one-dot chain line in FIG. 5D, a nickel film 38 and a gold film 39 having predetermined thicknesses are formed on the exposed surfaces of the shaft 31 and the flange portion 32 of each lead pin 30 and the exposed surface of each conductive member 18. Another electrode rod (not shown) may also be brought into contact with the substrate 3 or the frame 6 so that the nickel film 38 and the gold film 39 having the predetermined thicknesses are also formed on the surface of the package body 2.

Then, as illustrated in FIG. 5E, the ear portion 27 is removed from each ceramic plate 20a by inserting a cutter (not shown) into the ceramic plate 20a or irradiating the ceramic plate 20a with a laser beam along the cutting plane cf of the ceramic plate 20a, or by breaking the ceramic plate 20a along a braking groove (not shown) formed in advance along the cutting plane cf. Thus, only the ceramic plate 20 remains. As a result, the package 1 illustrated in FIGS. 1 to 3 is obtained.

The above-described method for manufacturing the package 1 has the above-described effects (7) to (9), and the package 1 having the above-described effect (1) can be obtained.

The present invention is not limited to the above-described embodiment.

For example, the substrate 3, the frame 6, the conductive members 18, the lead pins 30, and the cover plate 37 may instead be made of alloy 42 or alloy 194.

In addition, the ceramic plates 20, 20a may instead be made of aluminum nitride, mullite, or glass ceramic.

In addition, the light emitting element may instead be a light emitting diode.

In addition, a cylindrical optical fiber holder having an inner diameter equal to that of the clearance hole 10 may be provided adjacent to the clearance hole 10 so as to project from the corresponding outer side surface 8 of the frame 6.

In addition, the third through hole may instead have a circular, elliptical, or oval shape in plan view, and the main body 15 of the radiator 14 may have a shape similar to that of the third through hole, such as a circular shape, in plan view.

In addition, the flange portion 32 of each lead pin 30 may have an elliptical, oval, or rectangular shape in plan view.

Although the package 1 includes the frame 6, the package may instead include the substrate 3 that does not have the frame 6. In such a case, the package may be airtightly sealed by joining (fixing) a tubular cap that includes top and side surfaces and has an open bottom to the periphery of the front surface 4 of the substrate 3 in place of the metal cover plate 37.

Figure 6:
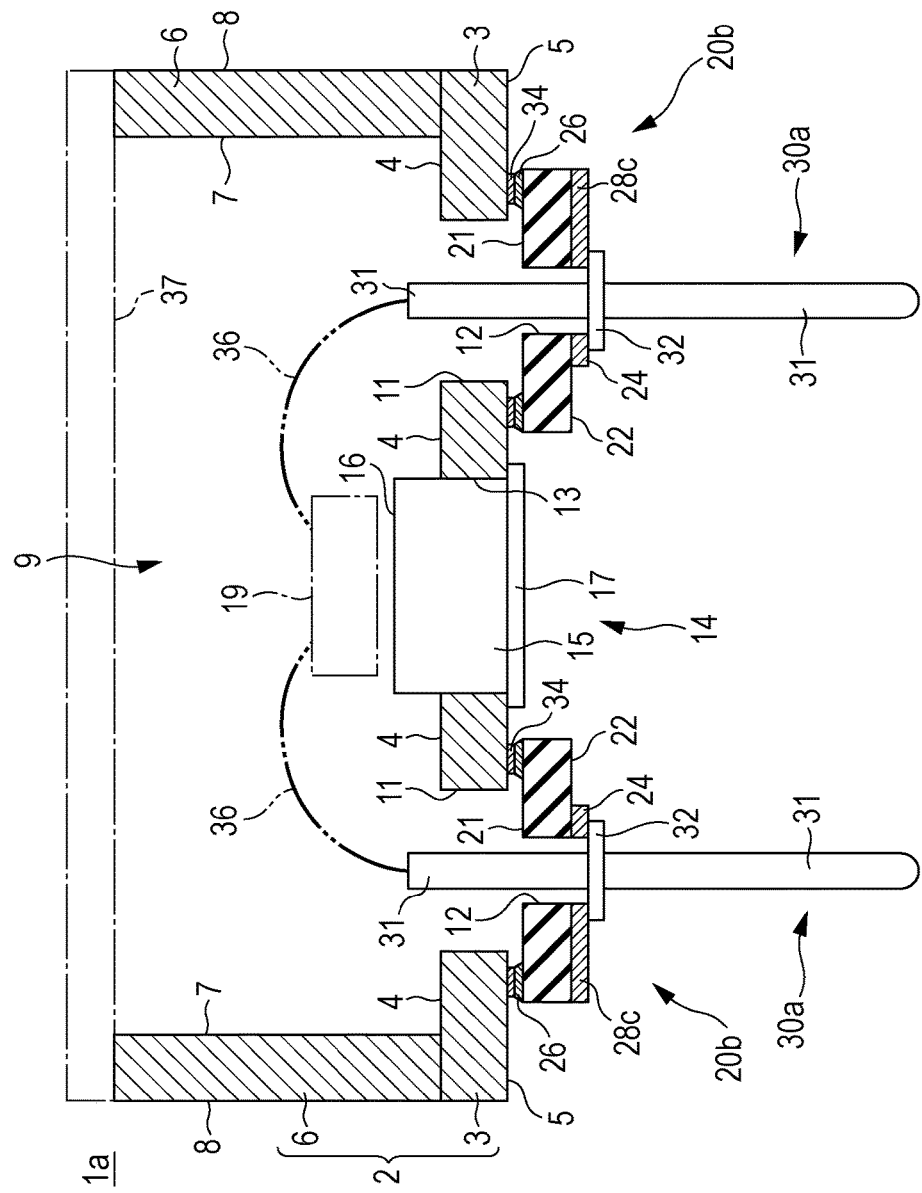
FIG. 6 is a vertical sectional view similar to FIG. 3, illustrating a package according to another embodiment.

Although the package 1 includes the conductive members 18, the conductive members 18 may be omitted as in a package 1a illustrated in FIG. 6. This package 1a includes lead pins 30a having shafts 31 that extend continuously through the first through holes 11 in the substrate 3 and second through holes 12 in ceramic plates 20b.

Each of the ceramic plates 20b is obtained by removing an ear portion similar to the ear portion 27 from a ceramic plate similar to the ceramic plate 20a.

In this case, the lead pins 30a which each include the shaft 31 that extend upward and downward from the flange portion 32 are prepared in advance. The flange portion 32 of each lead pin 30a is joined (fixed) to the corresponding conductive portion 24 in the region around the opening of the corresponding second through hole 12 in the opposing back surface 22 of the corresponding ceramic plate 20b. The conductive portions 23 and 25 may be omitted as in the ceramic plates 20b. In the package 1a according to the present embodiment, the lead pins 30a can be directly electrically connected to the light emitting element 19 mounted at the front surface 4 of the substrate 3 by, for example, the bonding wires 36. Therefore, a sufficient amount of current can be supplied in accordance with an increase in electrical power to be supplied to the light emitting element 19.

Figure 7:
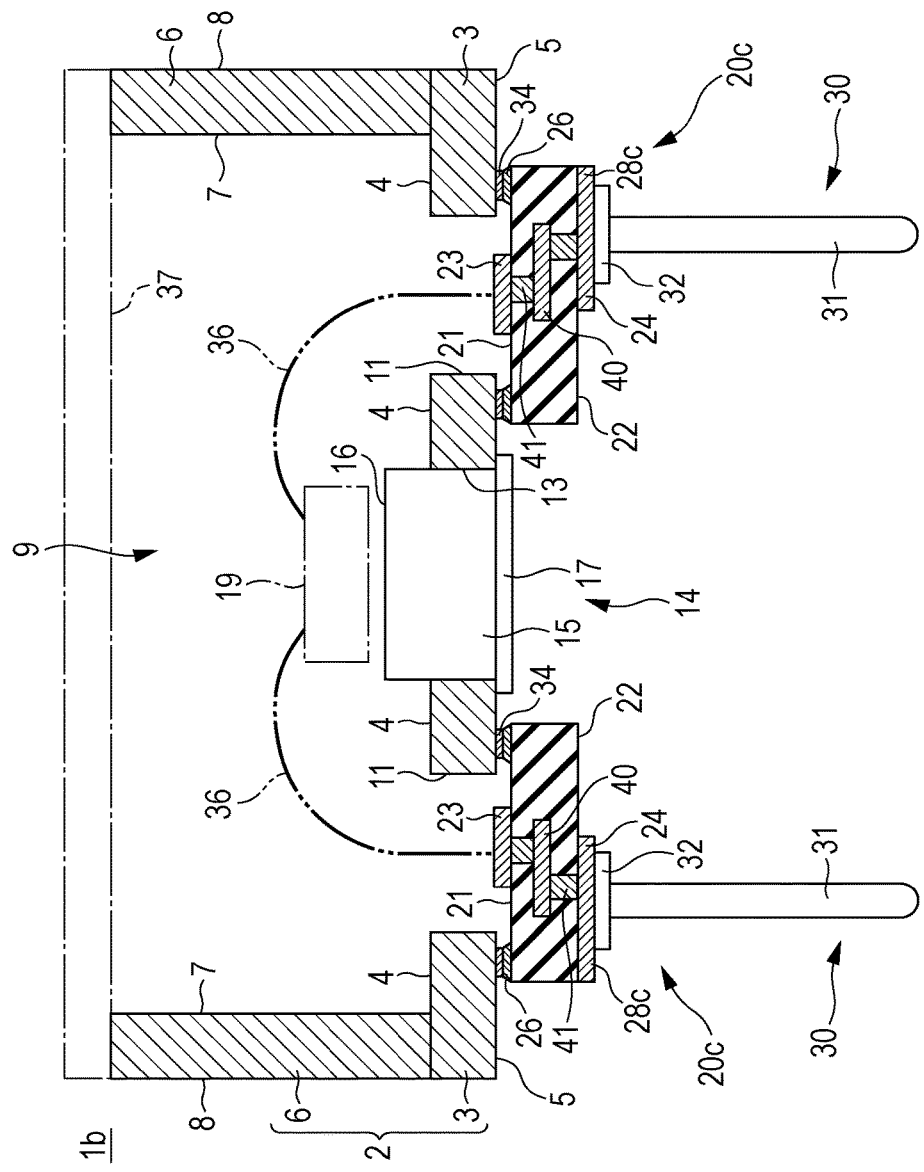
FIG. 7 is a vertical sectional view similar to FIG. 3, illustrating a package according to another embodiment.

In the package 1, each of the ceramic plates 20, 20a has the second through holes 12. However, the second through holes 12 may be omitted as in a package 1b illustrated in FIG. 7. This package 1b includes ceramic plates 20c which each include internal wiring 40 and a plurality of via conductors 41 that connect each conductive portion (pad) 23 on the opposing front surface 21 to the corresponding conductive portion 24 on the opposing back surface 22. Each of the ceramic plates 20c is also obtained by removing an ear portion similar to the ear portion 27 from a ceramic plate similar to the ceramic plate 20a.

In the package 1b, the internal wiring 40 and the via conductors 41 may be arranged to enable each conductive portion 23 on the opposing front surface 21 of each ceramic plate 20c and the corresponding conductive portion 24 on the opposing back surface 22 of the ceramic plate 20c to be disposed at different positions in plan view. Thus, the lead pins 30 joined to the conductive portions 24 can be flexibly arranged.

In the above-described embodiment, the connecting lines 28a to 28c are formed on the opposing back surface 22 of each of the ceramic plates 20, 20a. However, the connecting lines 28a to 28c may instead be formed in each of the ceramic plates 20, 20a to 20c. For example, each of the ceramic plates 20, 20a to 20c may be formed by stacking a plurality of ceramic layers, and the connecting lines 28a to 28c may be formed between the layers. These connecting lines 28a to 28c may be used to electrically connect the plating electrode 29 to any of the conductive portions 23, 24, and 25.

In addition, although the ceramic plates 20 are plate-shaped in the above-described embodiment, the shape of the ceramic plates is not limited as long as each ceramic plate includes at least a plate-shaped portion that can be joined to the substrate 3 in a surface-to-surface manner. For example, the ceramic plates may each include tubular portions that stand on the opposing front surface 21 of the ceramic plate 20 so as to surround the openings in the opposing front surface 21. In such a case, by inserting the tubular portions into the first through holes 11 formed in the substrate 3 and joining each ceramic plate to the substrate 3 in a surface-to-surface manner, the airtightness of the package can be increased. In addition, short-circuiting due to accidental contact of the inner wall surfaces of the first through holes 11 with the lead pins 30 extending through the first through holes 11 or the conductive members 18 can be prevented.

In addition, although the difference in coefficient of linear expansion between each ceramic plate 20 and the substrate 3 is 5 ppm ($K^{-1}$) or less in the above-described embodiment, the difference in coefficient of linear expansion is not limited to this as long as the joining section between each ceramic plate 20 and the substrate 3 is sufficiently airtightly sealed. For example, when the maximum linear length of the joining section between each ceramic plate 20 and the substrate 3 is 5 mm or less, sufficient airtightness can be ensured even when the difference in the coefficient of linear expansion is greater than 5 ppm ($K^{-1}$). In addition, when each ceramic plate 20 is joined to the substrate 3 with a stress-reducing member provided therebetween, sufficient airtightness can be ensured even when the difference in the coefficient of linear expansion is greater than 5 ppm ($K^{-1}$).

The present invention reliably provides a light-emitting-element mounting package that enables electrical power supplied to a light emitting element mounted at a front surface of a substrate to be easily increased and that can be reliably maintained airtight, and a method for manufacturing the package in a relatively small number of steps.

What is claimed is:

1. A light-emitting-element mounting package comprising:
   a substrate including a front surface and a back surface that opposes the front surface, the substrate defining a first through hole that extends through the substrate between the front surface and the back surface, the substrate provided with a mounting portion for a light emitting element at a front surface side of the substrate;
   a lead pin disposed at a back surface side of the substrate, the lead pin including a shaft and a flange portion radially extending from the shaft, the flange portion having a diameter greater than a diameter of the shaft; and
   a ceramic plate including an opposing front surface that opposes the back surface of the substrate, an opposing back surface that opposes the opposing front surface, and an outer periphery, the ceramic plate including a conductive portion formed at least on the opposing back surface of the ceramic plate, the ceramic plate including a connecting line having one end connected to the conductive portion and another end extending to the outer periphery of the ceramic plate, the connecting line being formed at least on the opposing back surface of the ceramic plate or in the ceramic plate,
   wherein the conductive portion formed on the opposing back surface of the ceramic plate is joined to the lead pin at the flange portion of the lead pin, and
   wherein the ceramic plate is joined to the back surface of the substrate in a region around an opening of the first through hole at the back surface of the substrate so that the lead pin is electrically connectable through the first through hole to the light emitting element to be mounted on the mounting portion for the light emitting element.

2. The light-emitting-element mounting package according to claim 1, wherein the ceramic plate defines a second through hole that extends through the ceramic plate between the opposing front surface and the opposing back surface,
   wherein the conductive portion is formed at least in a region around an opening of the second through hole at the opposing back surface of the ceramic plate, and
   wherein the ceramic plate is joined to the back surface of the substrate so that, in plan view, the shaft of the lead pin is disposed in the first through hole of the substrate.

3. The light-emitting-element mounting package according to claim 2, wherein the conductive portion is formed continuously on an inner wall surface of the second through hole, in a region around an opening of the second through hole at the opposing front surface, and in the region around the opening of the second through hole at the opposing back surface, wherein a conductive member having a diameter greater than an inner diameter of the second through hole is joined to the conductive portion formed in the region around the opening of the second through hole at the opposing front surface, and wherein at least a portion of the conductive member is disposed in the first through hole of the substrate and is spaced from an inner wall surface of the first through hole.

4. The light-emitting-element mounting package according to claim 3, wherein the diameter of the flange portion of the lead pin is greater than the inner diameter of the second through hole, and the diameter of the conductive member is smaller than an inner diameter of the first through hole.

5. The light-emitting-element mounting package according to claim 3, wherein the conductive portion formed in the region around the opening of the second through hole at the opposing front surface of the ceramic plate is surrounded by and spaced from the inner wall surface of the first through hole of the substrate, and wherein the substrate and the ceramic plate are joined together with a metalized layer and a solder layer provided therebetween, the metalized layer being formed on the opposing front surface of the ceramic plate so as to surround and be spaced from the conductive portion formed in the region around the opening of the second through hole at the opposing front surface, the solder layer being formed along the metalized layer.

6. The light-emitting-element mounting package according to claim 3, wherein the conductive portion formed on the inner wall surface of the second through hole defines a space, and the space is filled with a conductor that is the same material as a material that forms the conductive portion.

7. The light-emitting-element mounting package according to claim 3, wherein the conductive portion formed on the inner wall surface of the second through hole defines a space, and a connection conductor that connects the flange portion of the lead pin to the conductive member is disposed in the space.

8. The light-emitting-element mounting package according to claim 1, wherein the substrate defines a third through hole that extends through the substrate between the front surface and the back surface, wherein the substrate and the mounting portion for the light emitting element are separate components, wherein the mounting portion for the light emitting element is included in a radiator having a thermal conductivity higher than a thermal conductivity of the substrate, and wherein the radiator is joined to the substrate such that the radiator is inserted through the third through hole.

9. The light-emitting-element mounting package according to claim 8, wherein, in plan view, the third through hole is rectangular, square, or circular, and wherein the radiator is rectangular-parallelepiped-shaped, cubical, or solid cylindrical and includes a flange that extends along a periphery of a bottom surface of the radiator, the flange capable of being joined to the back surface of the substrate in a region around an opening of the third through hole at the back surface of the substrate.

10. The light-emitting-element mounting package according to claim 1, wherein a difference in coefficient of linear expansion between the substrate and the ceramic plate is 5 ppm ($K^{-1}$) or less.

11. A method for manufacturing a light-emitting-element mounting package including a substrate, a lead pin, and a ceramic plate, the substrate including a front surface and a back surface that opposes the front surface, the substrate provided with a mounting portion for a light emitting element at a front surface side of the substrate, the lead pin disposed at a back surface side of the substrate, the ceramic plate including an opposing front surface that opposes the back surface of the substrate and an opposing back surface that opposes the opposing front surface, the method comprising:

a step of preparing the substrate, the substrate defining a first through hole that extends through the substrate between the front surface and the back surface;

a step of preparing the ceramic plate, the ceramic plate including an ear portion having an outer side surface, the ear portion to be removed by dividing the ceramic plate, the ceramic plate including a conductive portion formed at least on the opposing back surface thereof, the ceramic plate including a plating electrode formed on the outer side surface of the ear portion, and the ceramic plate including a connecting line formed so as to extend between the plating electrode and the conductive portion at least in the ceramic plate or on the opposing back surface of the ceramic plate;

a step of joining the lead pin to the opposing back surface of the ceramic plate by joining a flange portion of the lead pin to the conductive portion on the opposing back surface of the ceramic plate, the flange portion radially extending from a shaft of the lead pin and having a diameter greater than a diameter of the shaft;

a plating step of applying an electric current to the plating electrode to form a metal film at least on outwardly exposed surfaces of the shaft and the flange portion of the lead pin by metal electroplating; and a step of joining the ceramic plate to the back surface of the substrate so that the lead pin is electrically connectable through the first through hole to the light emitting element to be mounted on the mounting portion for the light emitting element.

12. The method for manufacturing the light-emitting-element mounting package according to claim 11, wherein, in the step of preparing the ceramic plate, a second through hole is formed so as to extend through the ceramic plate between the opposing front surface and the opposing back surface, and the conductive portion is formed at least in a region around an opening of the second through hole at the opposing back surface of the ceramic plate, and wherein, in the step of joining the ceramic plate to the back surface of the substrate, the ceramic plate is joined to the back surface of the substrate so that, in plan view, the shaft of the lead pin is disposed in the first through hole of the substrate.

13. The method for manufacturing the light-emitting-element mounting package according to claim 12, wherein, in the step of preparing the ceramic plate, the conductive portion is formed continuously on an inner wall surface of the second through hole, in a region around an opening of the second through hole at the opposing front surface, and in the region around the opening of the second through hole at the opposing back surface, wherein the method further comprises:
a step of joining a conductive member to the conductive portion, the conductive member having a diameter greater than an inner diameter of the second through hole to the conductive portion, the conductive member jointed to the conductive portion in the region around the opening of the second through hole at the opposing front surface of the ceramic plate, and wherein, in the step of joining the ceramic plate to the back surface of the substrate, at least a portion of the conductive member is disposed in the first through hole of the substrate and is spaced from an inner wall surface of the first through hole.

14. The method for manufacturing the light-emitting-element mounting package according to claim 11, wherein the step of joining the ceramic plate to the back surface of the substrate is performed before the plating step.

15. The method for manufacturing the light-emitting-element mounting package according to claim 11, further comprising:
a step of removing the ear portion from the ceramic plate after the plating step.

* * * * *